United States Patent
Booth et al.

(10) Patent No.: US 7,157,963 B1
(45) Date of Patent: Jan. 2, 2007

(54) METHODS AND APPARATUS FOR CONTROLLING THE OUTPUT VOLTAGE OF A SWITCHED-MODE POWER SUPPLY

(75) Inventors: Andrew Booth, Bishop's Stortford (GB); Martin O'Flaherty, Bishop's Stortford (GB); Graham Dolman, Saffron Walden (GB)

(73) Assignee: Nortel Networks Limited, St. Laurent (CA)

( * ) Notice: Subject to any disclaimer, the term of this patent is extended or adjusted under 35 U.S.C. 154(b) by 163 days.

(21) Appl. No.: 10/887,264

(22) Filed: Jul. 8, 2004

(51) Int. Cl.
    *H03F 3/38* (2006.01)
(52) U.S. Cl. .................. 330/10; 330/297; 330/251; 330/207 A
(58) Field of Classification Search .................. 330/10, 330/297, 251, 207 A
    See application file for complete search history.

(56) References Cited

U.S. PATENT DOCUMENTS

| | | | | |
|---|---|---|---|---|
| 5,278,489 A | * | 1/1994 | Bowers ...................... | 323/225 |
| 5,973,556 A | * | 10/1999 | Su .............................. | 330/10 |
| 6,229,380 B1 | * | 5/2001 | Hedberg ...................... | 327/536 |
| 6,894,559 B1 | * | 5/2005 | Dolman ........................ | 330/10 |

* cited by examiner

*Primary Examiner*—Patricia Nguyen
(74) *Attorney, Agent, or Firm*—Barnes & Thornburg LLP (57) ABSTRACT

Linear power amplifiers tend to be inefficient. This is a particular problem for RF amplifiers in a cellular base station. In order to improve the efficiency of such amplifiers, attempts have been made to modulate the power supply to the amplifier proportional to the envelope of the signal to be amplified. An UMTS signal requires power supply modulation at frequencies of the order of 10 to 20 megahertz. When quantization noise is taken into account, oversampling becomes desirable. However, switching power supplies at frequencies of the order of 40 or 80 or even 160 megahertz becomes difficult. By modifying the coding of phases of the power supply to be switched so that the number of phases enabled is proportional to the desired power supply output voltage rather than the length of a pulse in a time domain on any particular phase being proportional to the output voltage, dramatic improvements are achieved in switching losses, balance between phases and accurate tracking of the input signal. Rotation of switching across the phases achieves good balance and by jittering or randomizing the rotation, switching noise may be moved out of band.

14 Claims, 9 Drawing Sheets

| Input | 5 | 5 | 5 | 5 | 5.3 | 5.3 | 5.3 | 5.3 | 5.3 | 5.3 | 5.3 | 5.3 |
|---|---|---|---|---|---|---|---|---|---|---|---|---|
| Input+Error | 5 | 5 | 5 | 5 | 5.3 | 5.6 | 4.9 | 5.2 | 5.5 | 4.8 | 5.1 | 5.4 |
| Coded | 5 | 5 | 5 | 5 | 5 | 6 | 5 | 5 | 6 | 5 | 5 | 5 |
| Error | 0 | 0 | 0 | 0 | 0.3 | -0.4 | -0.1 | 0.2 | -0.5 | -0.2 | 0.1 | 0.4 |
|  |  |  |  |  |  |  |  |  |  |  |  |  |
| Phase11 | 0 | 0 | 0 | 0 | 0 | 0 | 0 | 1 | 1 | 1 | 1 | 1 |
| Phase10 | 0 | 0 | 0 | 0 | 0 | 0 | 1 | 1 | 1 | 1 | 1 | 0 |
| Phase9 | 0 | 0 | 0 | 0 | 0 | 1 | 1 | 1 | 1 | 1 | 0 | 0 |
| Phase8 | 0 | 0 | 0 | 0 | 1 | 1 | 1 | 1 | 1 | 0 | 0 | 0 |
| Phase7 | 0 | 0 | 0 | 1 | 1 | 1 | 1 | 1 | 0 | 0 | 0 | 0 |
| Phase6 | 0 | 0 | 1 | 1 | 1 | 1 | 1 | 0 | 0 | 0 | 0 | 0 |
| Phase5 | 0 | 1 | 1 | 1 | 1 | 1 | 0 | 0 | 0 | 0 | 0 | 0 |
| Phase4 | 1 | 1 | 1 | 1 | 1 | 0 | 0 | 0 | 0 | 0 | 0 | 0 |
| Phase3 | 1 | 1 | 1 | 1 | 0 | 0 | 0 | 0 | 0 | 0 | 0 | 1 |
| Phase2 | 1 | 1 | 1 | 0 | 0 | 0 | 0 | 0 | 0 | 0 | 1 | 1 |
| Phase1 | 1 | 1 | 0 | 0 | 0 | 0 | 0 | 0 | 0 | 1 | 1 | 1 |
| Phase0 | 1 | 0 | 0 | 0 | 0 | 0 | 0 | 0 | 1 | 1 | 1 | 1 |

⟶ Time (each column represents 1 sample time)

Sample 1 = 5, Code 5 ones and 7 zeros.
Sample 2 = 5, Code 5 ones and 7 zeros, with starting phase rotated by 1.
Sample 4 = 5.3 Code 5 ones and 7 zeros, with starting phase rotated by 1. Error = 5.3-5=0.3
Sample 5 = 5.3, Add error of 0.3 to give 5.6. Code as 6. etc

METHODS AND APPARATUS FOR CONTROLLING THE OUTPUT VOLTAGE OF A SWITCHED-MODE POWER SUPPLY

TECHNICAL FIELD

This invention relates to methods and apparatus for controlling the power supply voltage in a multi-phase, switched-mode power supply, to software for controlling a switched mode power supply, to a power supply unit, to an RF amplifier and to a cellular base station. Although described below in connection with RF power amplifiers, it will be appreciated by the person skilled in the art that the power supply control techniques disclosed in the present specification have general applicability to fields outside the control of RF amplifier power supply control.

BACKGROUND OF THE INVENTION

It is desirable, particularly in cellular base station applications, to be able to accurately and quickly control the power supply voltage provided to a radio frequency (RF) amplifier. Linear power amplifiers are fundamentally inefficient. This means that large, expensive RF power transistors are required and that these transistors require large heat sinks. This increases the size and operating cost of a cellular base station. By selecting and adjusting the power supply voltage to such an amplifier, it is possible to dramatically improve the electrical efficiency of the amplifier. This is particularly important in base station applications where the cost of the power supply and appropriate cooling apparatus makes up a significant proportion of the overall cost of the base station. Thus improvements in the area of efficiency allow smaller power supplies, reduced losses (generally released as heat in the base station) and reductions in the capacity and therefore cost of the base station cooling apparatus.

The conventional approach to this problem is to adjust to the power supply voltage to the RF amplifier synchronously with the envelope of the signal to be amplified by the RF amplifier.

This is usually achieved by pulse width modulating the output of the power supply. However, it must be noted that a four-channel UMTS system has envelope bandwidths typically in the range of 10 to 20 megahertz. To modulate a power supply at this rate using conventional pulse width modulated (PWM) power supplies would require a PWM rate somewhat in excess of these frequencies (to ensure that quantisation noise is moved out of the band of interest). Typically, such power supplies have a plurality of phases. Each phase contributes a predetermined voltage to an overall composite output voltage which is summed with that of the contribution from other phases. Straightforward pulse width modulation is unsuitable since it has insufficient noise performance. Furthermore, the efficiency of such conventional power supplies is low due to high switching losses at high switching frequencies and to high peak currents. One prior art option is a so-called "8+4" arrangement in which there are eight phases contributing an equal voltage to the output voltage, and four intermediate phases between each of the eight phases contributing a smaller amount. However, this arrangement provides a marginal noise performance and because the phases are not all equal, balancing between phases is difficult which can lead to early failure of the switching components and high switching losses.

SUMMARY OF THE INVENTION

In accordance with a first aspect of the invention there is provided a method of controlling the power supply voltage in a multi-phase switched-mode power supply for an amplifier comprising receiving an input signal representative of a desired power supply voltage over a predetermined time period, processing the input signal to derive a phase value indicative of the number of power supply phases which should be enabled to achieve the desired power supply voltage, and outputting a phase signal for activating only the number of phases indicated by the phase value, for substantially the predetermined time.

In conventional PWM the output of each phase is arranged such that each phase is activated for a length of time proportional to the desired output voltage of the power supply. In other words, the width of the pulse is modulated on each phase proportionally to the desired output voltage; a larger required output voltage resulting in a longer pulse width. However, in the present invention, higher voltage outputs are achieved by activating a larger number of phases in any particular sampling time period. Thus the approach presented in the present specification is not strictly, PWM because the width of the pulses is not chosen in proportion to the desired output voltage. This has the significant advantage that balancing of the phases is more readily achieved. One approach to such balancing, which is described in more detail below, is to rotate the phases after each sampling time period so that, for example, even if the desired output voltage of the power supply were constant, the distribution of energy across the phases would still be evenly balanced across all phases. Additionally, switching losses are reduced by reducing the number of switching transitions needed to achieve a desired output. This allows the modulation section of the power supply to operate at improved efficiency levels.

Also, the tracking of the power supply voltage against a desired voltage is much more accurate than prior art attempts. By setting a value across phases at each sample period the output voltage is closer to a desired value. Instead, conventional PWM "smears" the desired value across several time samples resulting in instantaneous errors even though over time the results may on average be reasonably accurate.

Preferably, the error between an ideal desired output of the power supply and the actual quantised output is fed forward to the next cycle so that the next phase signal can be adjusted to take account of the cumulative error.

In accordance with a second aspect of the invention there is provided a computer program which when executed on a switched mode power supply controller causes the controller to receive an input signal representative of a desired power supply voltage over a predetermined time period, process the signal to derive a phase value indicative of the number of power supply phases which should be enabled to achieve the desired power supply voltage, and output a phase signal for activating only the number of phases indicated by the phase value, for substantially the predetermined time.

In a third aspect, there is provided a controller for a switched mode, multi-phase power supply comprising input means arranged to receive an input signal representative of a desired power supply voltage over a predetermined time period, processing means arranged to process the input signal to derive a phase value indicative of the number of power supply phases which should be enabled to achieve the desired power supply voltage, and output means arranged to output a phase signal for activating only the number of phases indicated by the phase value, for substantially the predetermined time.

In a further aspect, there is provided a switched mode, multi-phase power supply comprising input means arranged to receive an input signal representative of a desired power supply voltage over a predetermined time period, processing means arranged to process the input signal to derive a phase value indicative of the number of power supply phases which should be enabled to achieve the desired power supply voltage, phase activation means arranged to activate only the number of phases indicated by the phase value, for substantially the predetermined time.

In another aspect, the invention provides a RF amplifier unit including an amplifier and a switched mode, multiphase power supply, the power supply comprising input means arranged to receive an input signal representative of a desired power supply voltage over a predetermined time period, processing means arranged to process the input signal to derive a phase value indicative of the number of power supply phases which should be enabled to achieve the desired power supply voltage, phase activation means arranged to activate only the number of phases indicated by the phase value, for substantially the predetermined time.

In a yet further aspect, the invention provides a cellular base station including a RF amplifier unit having an amplifier and a switched mode, multiphase power supply, the power supply comprising input means arranged to receive an input signal representative of a desired power supply voltage over a predetermined time period, processing means arranged to process the input signal to derive a phase value indicative of the number of power supply phases which should be enabled to achieve the desired power supply voltage, phase activation means arranged to activate only the number of phases indicated by the phase value, for substantially the predetermined time.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

Figure 1:
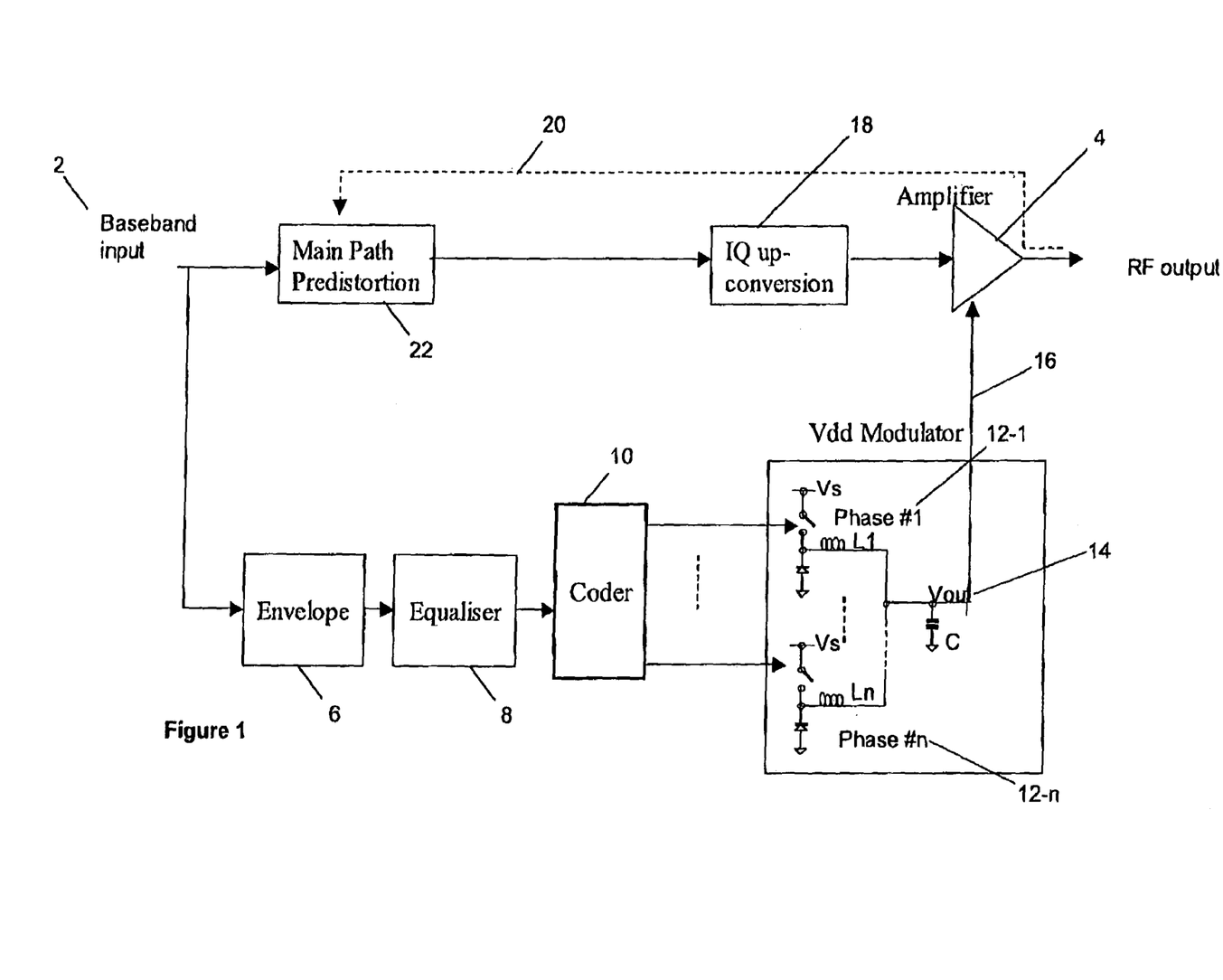
FIG. 1 is a block diagram of a switched mode, multi phase power supply.

With reference to FIG. 1, a baseband input 2 receives a signal to be amplified by an RF amplifier 4. The signal typically would be a broadcast signal, for example, for a cellular base station. The baseband input is also fed to a filter 6 a which generates a signal representative of the of envelope of the baseband signal. This is equalised in equaliser 8 and then passed to a coder 10, which is described in more detail below.

The function of the coder 10 is to determine which of a plurality of switched mode power supply phases 12-1 to 12-n will be activated, summed by a summer 14, filtered and fed as a modulated power supply voltage 16 to the amplifier 4.

As is known in the art, the baseband input is passed through an IQ upconverter 18 and predistortion 20 is applied via a main path predistorter 22 in order to counteract distortions introduced by the amplifier 4.

Figure 2:
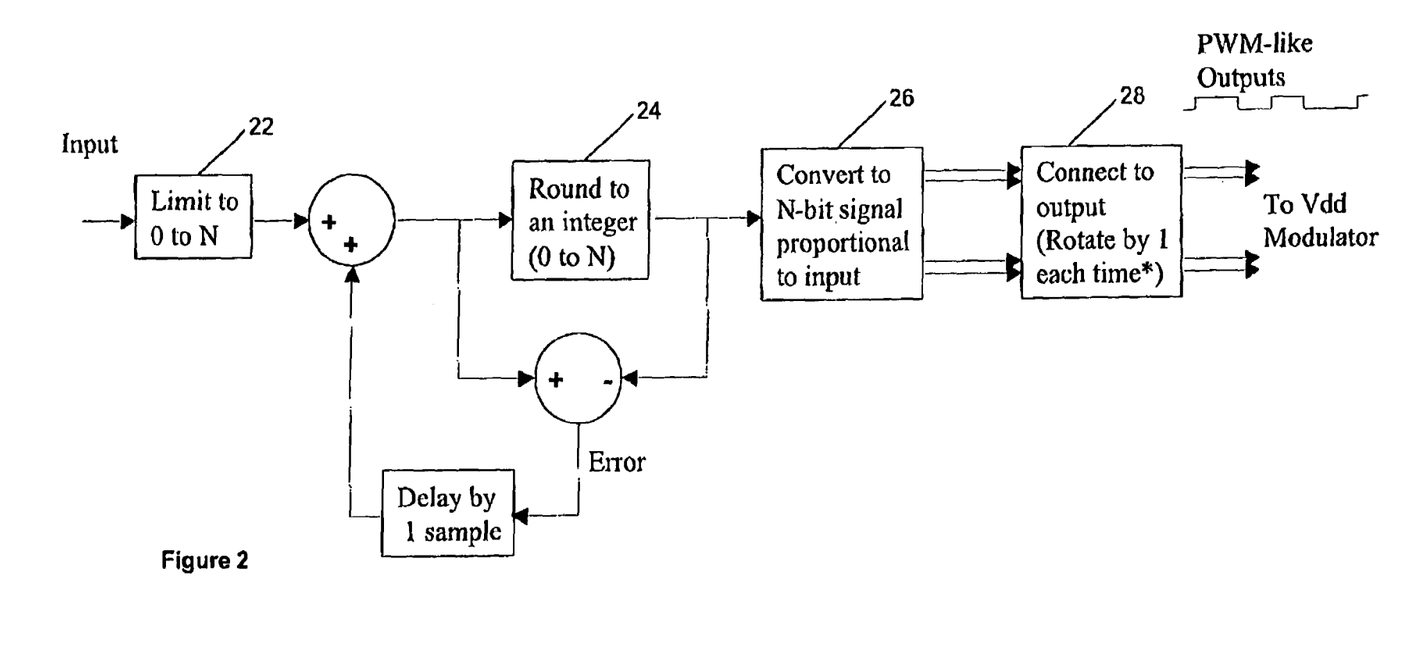
FIG. 2 is a block diagram of the coder of FIG. 1.

With reference to FIG. 2, the coder 10 is now described in more detail. The input to the coder 10 typically is a numerical value representative of a desired output voltage 16 for the power supply. In the example described below, the value is representative of the envelope of an RF a signal to be amplified. Typically, the numerical value is directly proportional to the desired output voltage and thus in the example described below, in which each of the phases 12-1 to 12-n are equal, the numerical value will effectively be an indication of the number of phases which must be activated.

Firstly, however, the input numerical value must be scaled to the number of phases N. This is achieved in the box labelled 22. The value coming out of the scaler 22 is a real value, for example, a value such as 5.3.

The real value is then rounded to an integer in the rounder 24. The rounding approach taken may, for example, be the conventional approach of rounding anything from 0.5 above to the next integer. However, as will be explained below, if error correction is implemented, the precise rounding technique is not particularly relevant and an approach in which the fractional element of the real number produced by scaler 22 is stripped (ie always rounding down), will produce a reasonable result.

In Box 26, the integer value is converted to an N bit signal which is proportional to the input. The number of bits is the same as the number of phases available in the power supply and shown as items 12-1 to 12-n in FIG. 1. Thus, for example, if there are 12 phases, an integer value of three will be coded as three set bits and nine unset bits. Similarly, the value of five will be coded as a five set bits and seven unset bits. The precise selection of which bits should be set and which bits should be unset is described in detail below. This selection has important consequences for the efficiency of the power supply and also the quantisation noise spectrum.

Box 28 has the function of connecting the N bit signal to the phases and 12-1 to 12-n in order to activate the appropriate phases to produce the desired output voltage.

Figure 3:
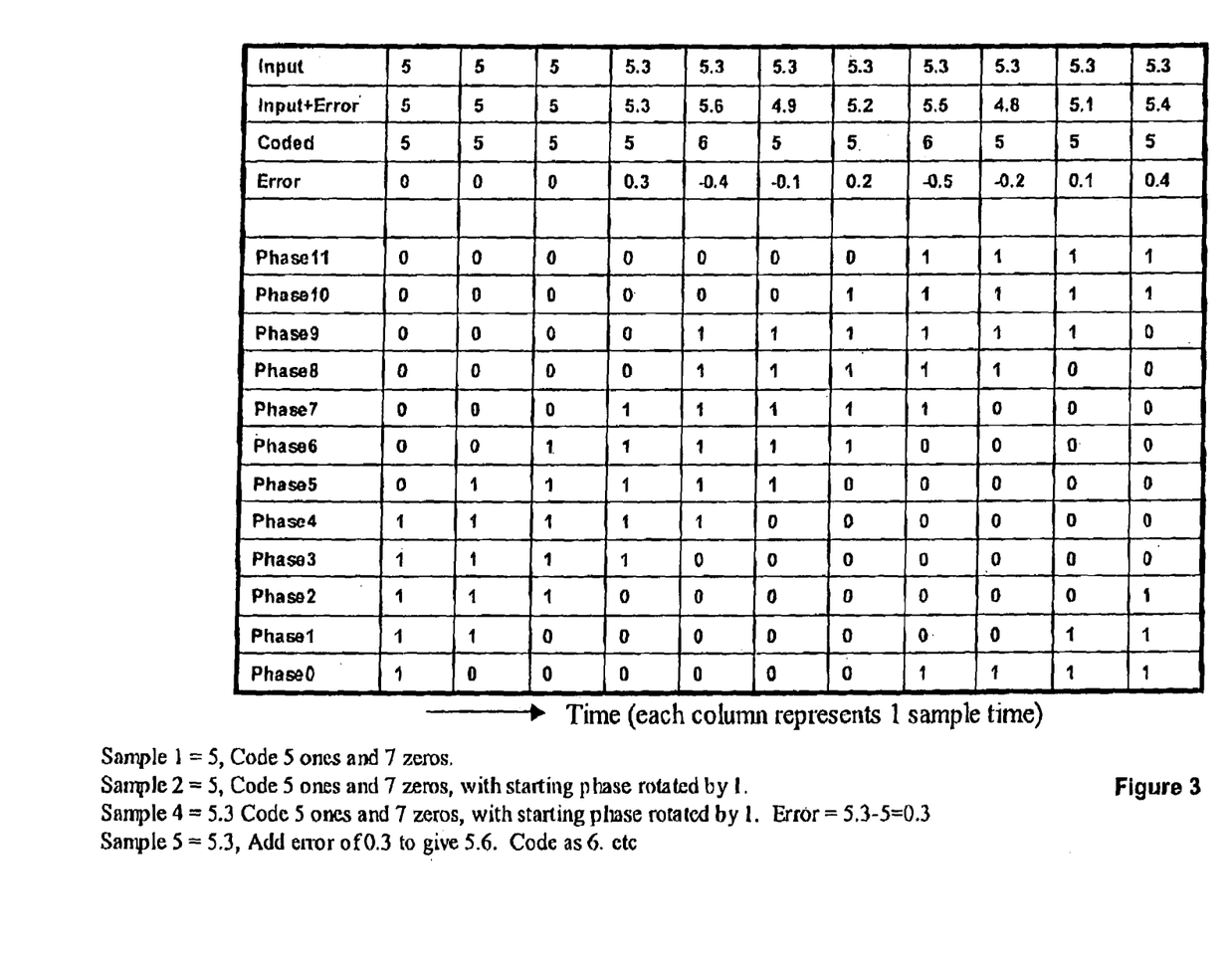
FIG. 3 is a table showing an example input signal against activated power supply phases.

With reference to FIG. 3, a set of exemplary samples are shown. In this case, the power supply has 12 phases numbered phase 0 to phase 11. The relevant 12 bit word is shown in each vertical column. Each vertical column represents a single clock period and for a single envelope sample. A bit which is set causes the relevant phase to be activated and to contribute its predetermined voltage to the summed output voltage of the power supply unit. It will, of course, be appreciated by those skilled of the art that a set bit may instead mean that that particular phase is deactivated. Alternative communication schemes for phases may also be considered. Also, any number of phases may be used. The important fact as explained below, is which phases are activated and which are not.

Looking at the first vertical column on the left, it will be noted that the input signal is 5. Thus five phases are activated (phase 0 to phase 4). In the next clock cycle, the input is again at 5. However, in this case, the phases which are activated are rotated across the phases by one position so that phases 1 to 5 are activated. As explained briefly above, this has the effect of balancing the phases which improves efficiency and lifetime of the switching components.

Moving on to column four of the table, it will be noted that the input signal has now increased to a value of a 5.3. This is coded as five phases being activated (in this case phases 3 to 7). Thus, there is now an error of 0.3 (i.e. the difference between 5 and 5.3).

In the next column, the input is again 5.3 but with the error from the previous clock cycle, the required code is 5.6. Thus in this clock cycle the coder 10 codes 6 set bits in order to activate six phases.

Figure 4:
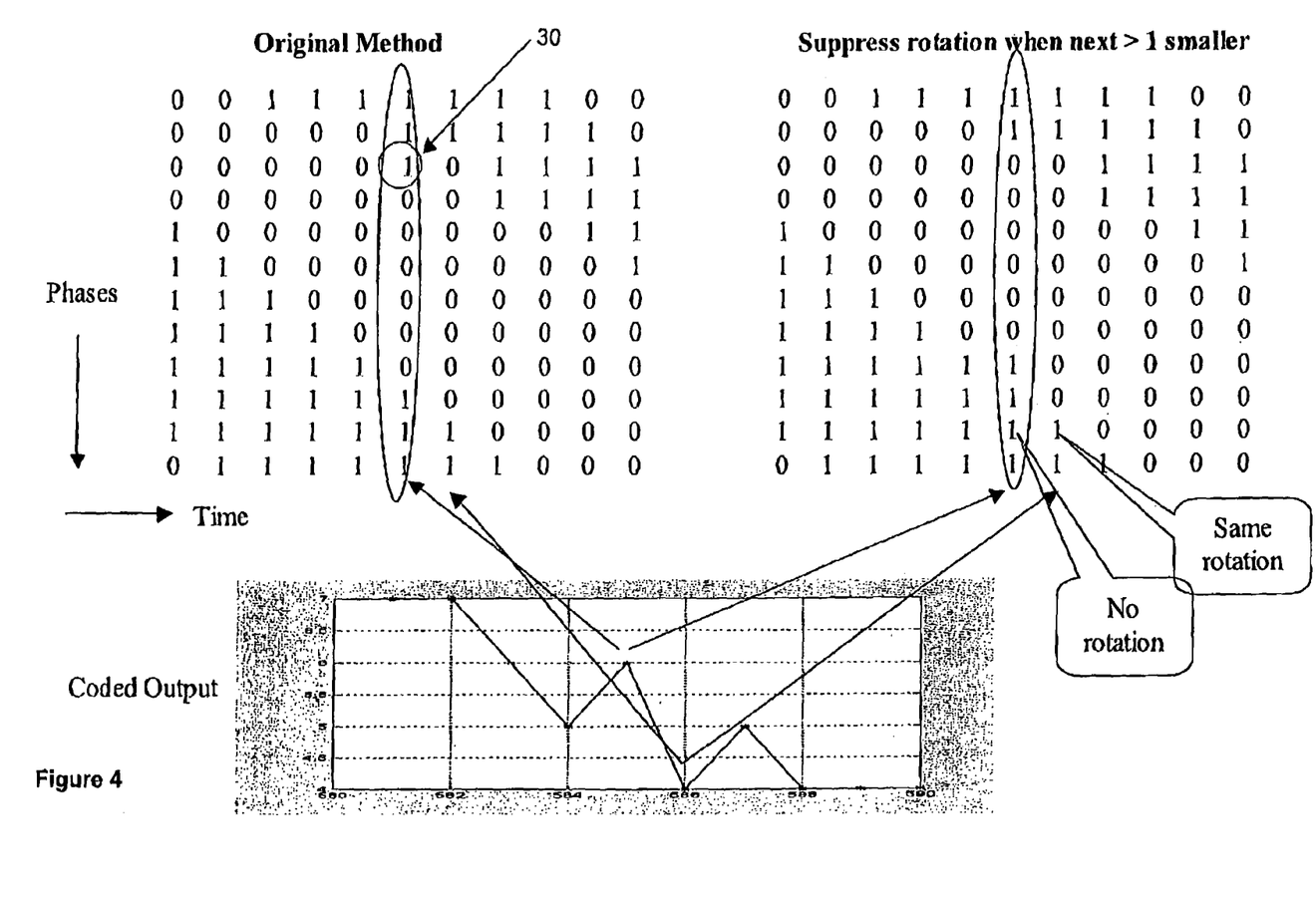
FIG. 4 is a table showing the optional feature of rotation suppression.

Generally speaking, it is undesirable to allow a phase to only be activated for a short period of time, such as a single clock cycle. With reference to FIG. 4, it will be noted that using rotations across the phases after every clock cycle, the set of bits shown in the left-hand table includes a bit 30 which is set for only a single clock cycle. This situation may be avoided as shown in the right-hand table, by suppressing rotation in any case in which the next clock cycle requires a number of phases to be activated which is more than one less than the present cycle. Thus in the circled example shown in the Figure, the number of phases changes from six in the circled column to four in the next column. By suppressing rotation, the coded output remains the same and thus the power supply voltage output remains the same, but the activation of phase nine for only a single clock cycle is avoided.

Figure 5:
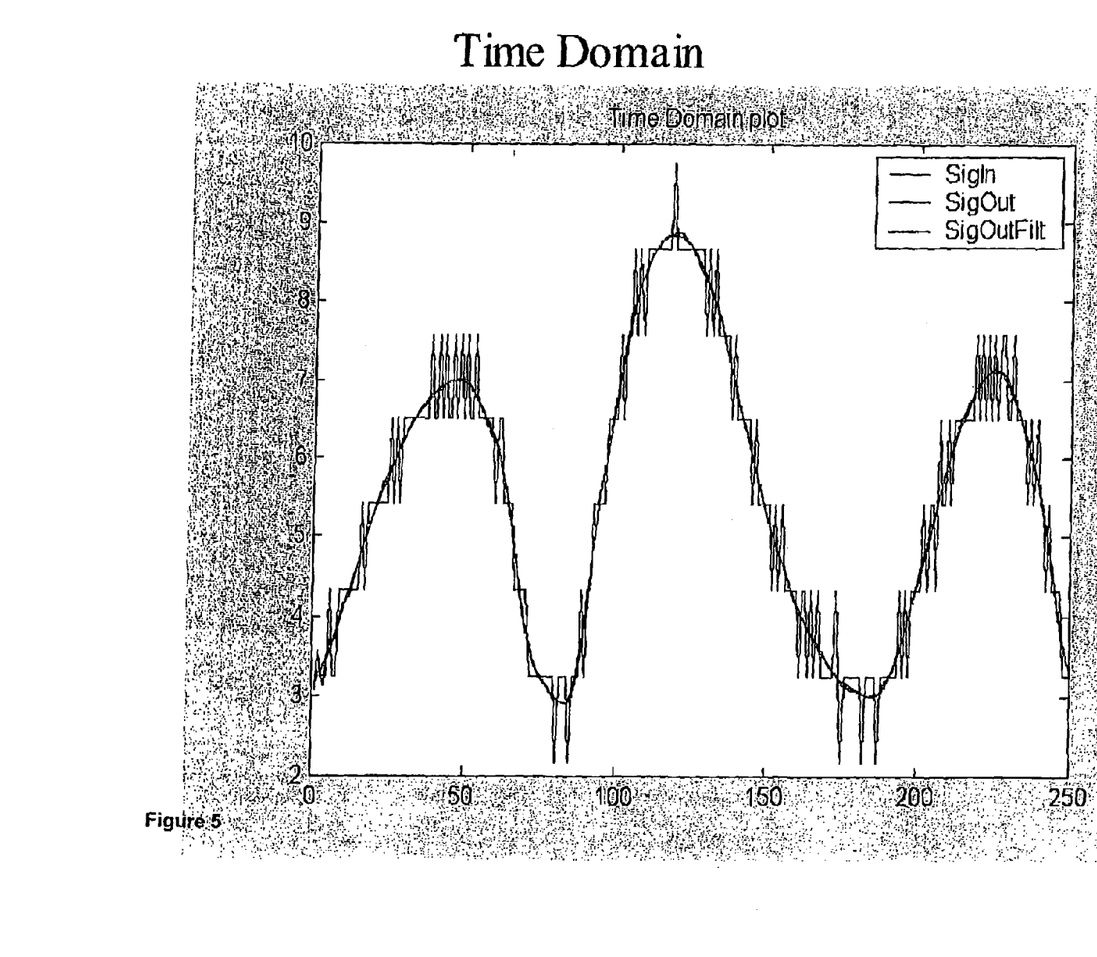
FIG. 5 is a time domain plot showing an input signal against an output signal.

FIG. 5 shows a time domain plot of a sample input signal passed through the coder of FIGS. 1 and 2. In the plot, the highly quantised (spiky) plot is the unfiltered output signal of the power supply. The spikes show the quantisation noise. The filtered output signal (which includes an anti-aliasing low pass the filter) is so close to the input signal that the two plots are virtually indistinguishable.

Figure 6:
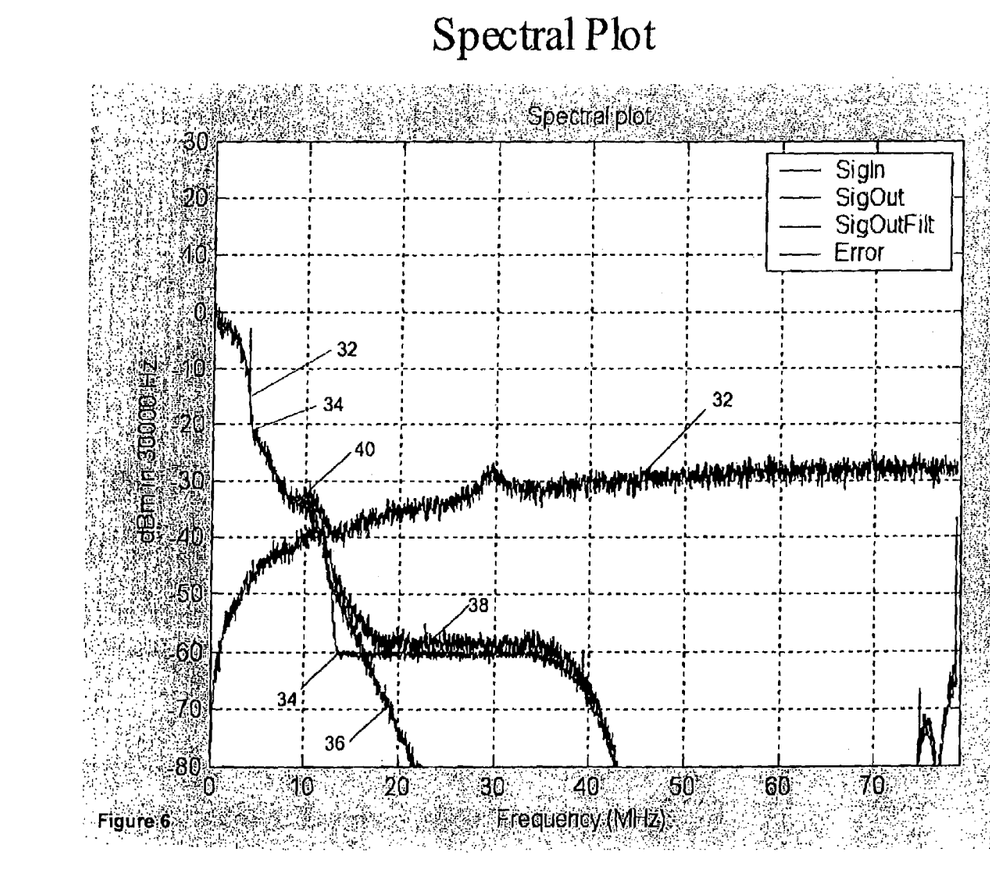
FIG. 6 is a frequency domain plot equivalent to the plot of FIG. 5.

In FIG. 6, the signal is analysed in the frequency domain. In this case, it will be seen that the unfiltered output signal 32 generally follows the input signal 34 up to about 12 MHz. The filtered output signal 36 rolls-off sharply beyond that point (which is above the frequency band of interest). The error shown by plot 38 is the difference between the filtered output signal 36 and the input signal 34. In the band of interest the frequency tracking is extremely good. Outside the band of interest, of course, quantisation and aliasing noise is present as shown by the unfiltered output 32 at frequencies above 12 MHz. This is filtered to produce the plot 36.

However, there is one feature to note in the plot and that is a small peak 40 at around 13 megahertz. This occurs as a function of the sampling frequency chosen (160 megahertz) divided by the number of phases (12). By choosing alternative rotation schemes (some of which are described below) such frequency spectrum anomalies may be reduced and/or removed entirely.

Figure 7:
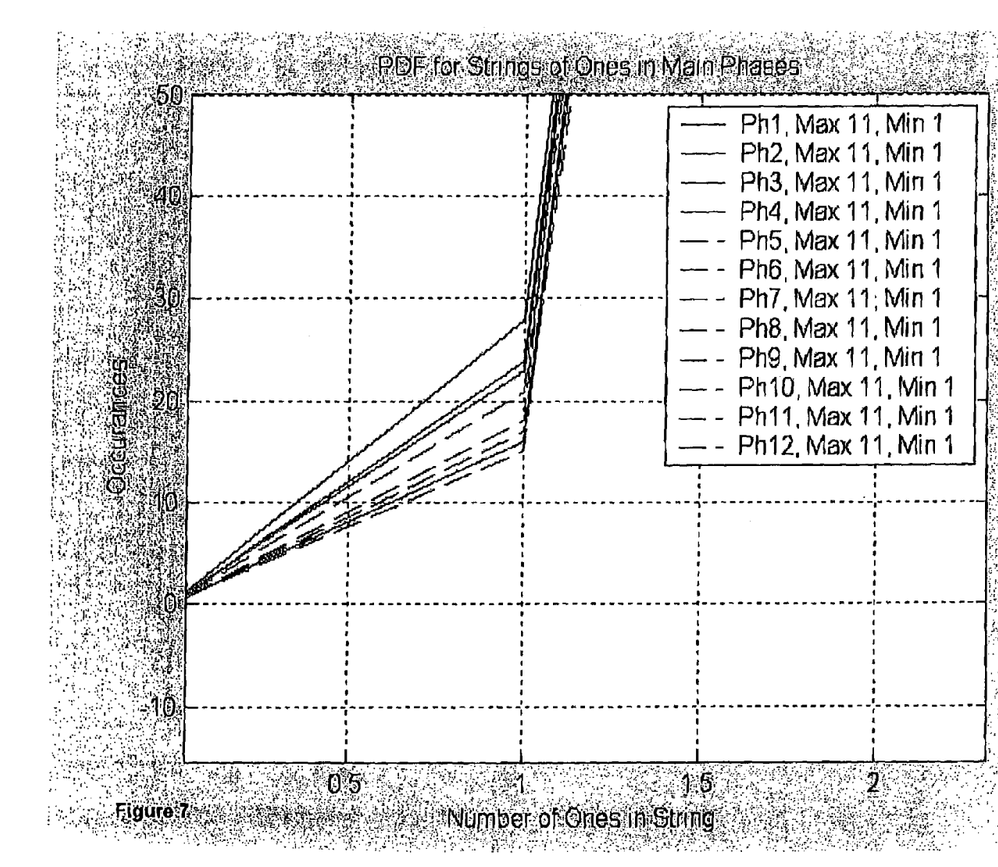
FIG. 7 shows the probability distribution function of phases switched for a single clock period.
Figure 8:
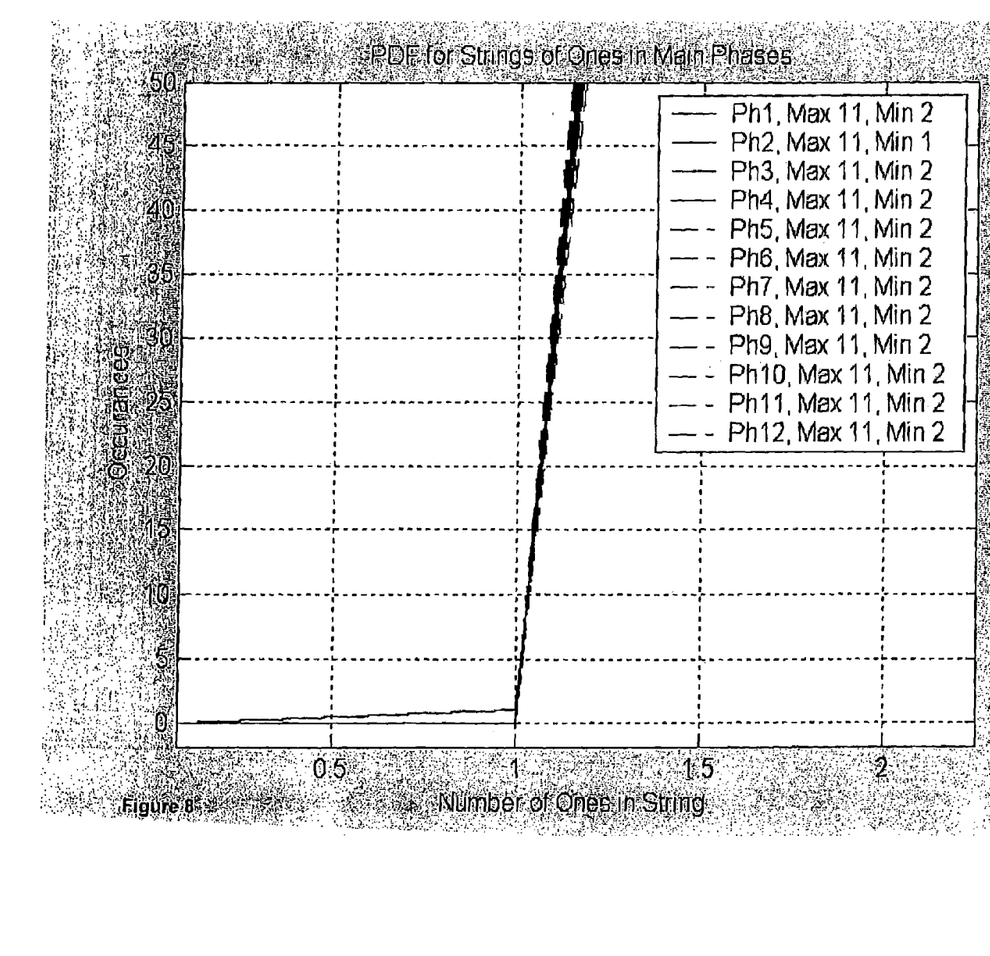
FIG. 8 is a pot similar to FIG. 7 of an alternative embodiment in which single clock period switching is mitigated.

FIG. 7 shows the distribution of a single ones in any particular phase looking horizontally across a table of the type shown in the FIG. 3. Thus this plot shows the distribution of phases which are activated for only a single clock cycle. It will be noted that in the sample shown, approximately 20 single ones occur in each phase. By applying the rotation suppression technique discussed above in connection with FIG. 4, the results are as shown in FIG. 8. It will be noted that only one phase included a single activation for a single clock cycle.

As noted above, it is desirable to provide as smooth a frequency spectrum as possible in the band of interest so that tracking of the input signal is optimised. The relatively simple embodiment of rotating the phases to be activated by a single phase on most clock cycles produces energy in the spectrum as a function of the sampling frequency and the number of phases. Thus by smoothing the switching of the phases in some way or randomising the timing of the rotations, the energy in that peak (in the example this was at 13 megahertz) may be spread throughout the spectrum and preferably spread outside the band of interest.

Figure 9:
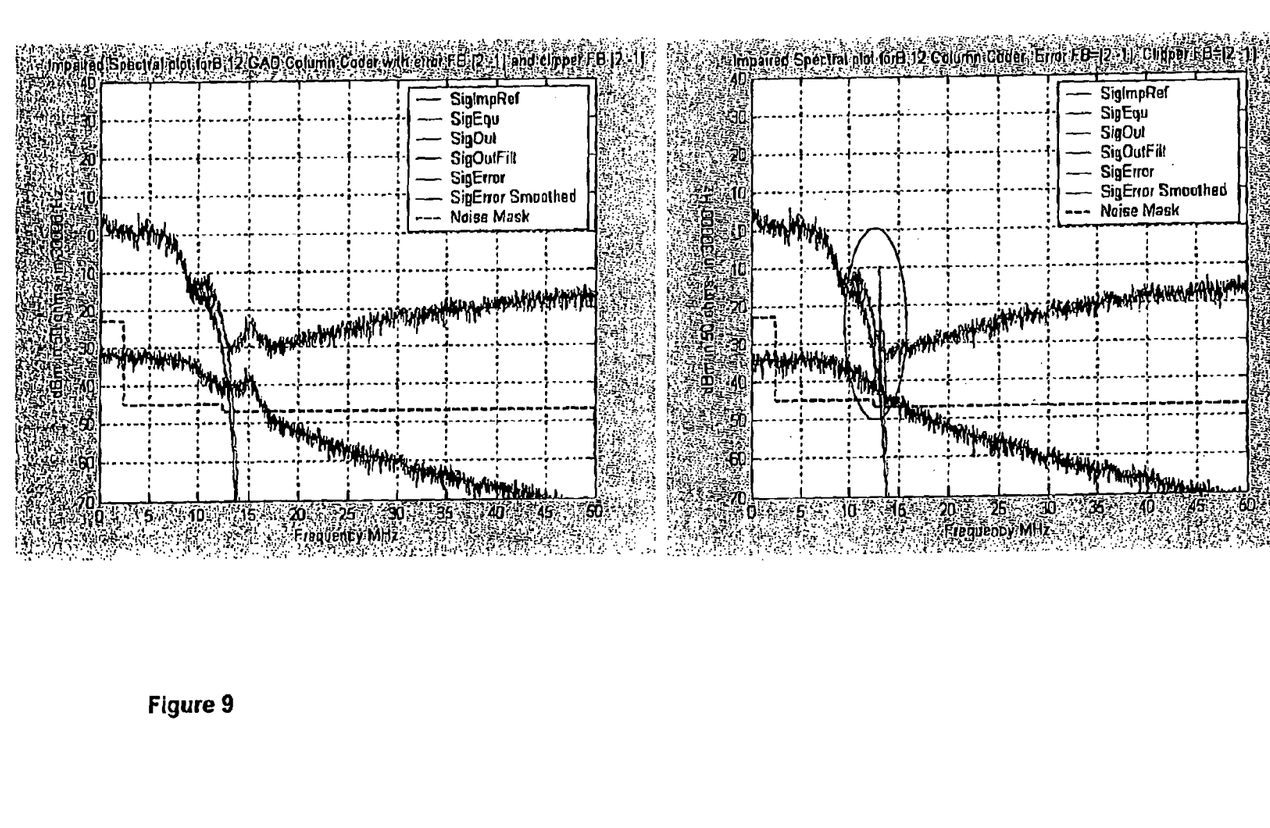
FIG. 9 is a pair of plots comparing noise distribution in alternative phase rotation schemes.

One such example of an alternative rotation scheme is described in connection with FIG. 9. In this alternative scheme, rotation is suppressed when the number of phases to be activated in the present cycle is greater than the number of phases in the previous cycle. In all other situations, the phases which are to be activated are rotated by the number of positions equivalent to the difference between the number of activated phases in the present state and the previous state plus one. With reference to FIG. 9, it will be noted that the plot on the right (which shows a basic rotation scheme as described above) includes a peak at 13 megahertz. The plot on the left shows a greatly reduced peak at 13 megahertz and some of that energy has been moved to a smoother peak at 15 megahertz. The plot on the left uses the suppression rotation scheme described immediately above. Thus by moving the phases by more than one position, the noise introduced by the rotation operation is spread across the spectrum.

A further alternative is to deliberately randomise the number of positions moved during the rotation operation. One example of such a randomisation is to suppress rotations in the same way as described immediately above. However, when the rotation is to occur, rotation is made by the difference between the number of phases activated in the present state and in the previous state when the number of phases in the present state is less than that of the previous state. If the present state and previous state are equal then rotation occurs, for example, by one or two positions but randomised to ensure an average of approximately 1.5.

It will be appreciated that the present invention may be implemented in hardware or in software. It may also be implemented using FPGA or ASIC technology and these implementations are intended to be included in the scope of the hardware and software descriptions and claims of this specification.

What is claimed is:

1. A method of controlling the power supply voltage in a multi-phase switched-mode power supply for an amplifier comprising:
    (a) receiving an input signal representative of a desired power supply voltage over a predetermined time period,
    (b) processing the input signal to derive a phase value indicative of the number of power supply phases which should be enabled to achieve the desired power supply voltage, and
    (c) outputting a phase signal for activating only the number of phases indicated by the phase value, for substantially the predetermined time, the method further comprising receiving a series of said input signals related respectively to a series of said predetermined time periods, arranging for said phase signal to select the phases to be activated in each time period, recording any error between the desired power supply voltage and an actual power supply voltage produced by the switched-mode power supply and feeding an error signal forward into the next time period to adjust the next phase signal to take account of the recorded error.

2. A method according to claim 1, wherein the error signal is filtered.

3. A method according to claim 1 comprising receiving a series of said input signals related respectively to a series of said predetermined time periods and arranging for said phase signal to select the phases to be enabled in each time period so that over time each phase is enabled for substantially the same proportion of time as each other phase.

4. A method according to claim 3, wherein the phase signal is arranged to perform a shift and rotate operation across the phases for each successive time period.

5. A method according to claim 4, wherein the shift and rotate operation is suppressed if the number of phases to be activated in the next time period is two or more less than the present time period, whereby the likelihood of any phases being activated for only one time period is reduced.

6. A method according to claim 4, wherein the shift and rotate operation is suppressed if the number of phases to be activated in the next time period is greater than the number of phases to activated in the present time period otherwise, the shift and rotate operation is carried out and the rotation is made by one position more than the difference between the number of phases to be activated in the next time period is and the number of phases activated in the present time period.

7. A method according to claim 1, wherein the contribution of each phase to the composite output voltage is generally equal.

8. A method according to claim 1, wherein the amplifier is an RF amplifier and said input signal is representative of the signal envelope of a signal to be amplified by the RF amplifier.

9. A computer program which when executed on a switched mode power supply controller causes the controller to:
  (a) receive an input signal representative of a desired power supply voltage over a predetermined time period;
  (b) process the signal to derive a phase value indicative of the number of power supply phases which should be enabled to achieve the desired power supply voltage, and
  (c) output a phase signal for activating only the number of phases indicated by the phase value, for substantially the predetermined time,
the computer program also being arranged to cause said controller to receive a series of said input signals related respectively to a series of said predetermined time periods, to arrange for said phase signal to select the phases to be activated in each time period, to record any error between the desired power supply voltage and an actual power supply voltage produced by the switched-mode power supply and to feed an error signal forward into the next time period to adjust the next phase signal to take account of the recorded error.

10. A controller for a switched mode, multi-phase power supply comprising a signal input arranged to receive an input signal representative of a desired power supply voltage over a predetermined time period, a processor arranged to process the input signal to derive a phase value indicative of the number of power supply phases which should be enabled to achieve the desired power supply voltage, and a phase output arranged to output a phase signal for activating only the number of phases indicated by the phase value, for substantially the predetermined time, the controller being adapted to receive a series of said input signals related respectively to a series of said predetermined time periods, to arrange for said phase signal to select the phases to be activated in each time period, to record any error between the desired power supply voltage and an actual power supply voltage produced by the switched-mode power supply and to feed an error signal forward into the next time period to adjust the next phase signal to take account of the recorded error.

11. A switched mode, multiphase power supply comprising a signal input arranged to receive an input signal representative of a desired power supply voltage over a predetermined time period, a processor arranged to process the input signal to derive a phase value indicative of the number of power supply phases which should be enabled to achieve the desired power supply voltage, and a phase activator arranged to activate only the number of phases indicated by the phase value, for substantially the predetermined time, the processor being further arranged to receive a series of said input signals related respectively to a series of said predetermined time periods, to arrange for said phase value to select the phases to be activated in each time period, to record any error between the desired power supply voltage and an actual power supply voltage produced by the switched-mode power supply and to feed an error signal forward into the next time period to adjust the next phase value to take account of the recorded error.

12. A RF amplifier unit including an amplifier and a switched mode, multiphase power supply, the power supply comprising a signal input arranged to receive an input signal representative of a desired power supply voltage over a predetermined time period, a processor arranged to process the input signal to derive a phase value indicative of the number of power supply phases which should be enabled to achieve the desired power supply voltage, and a phase activator arranged to activate only the number of phases indicated by the phase value, for substantially the predetermined time, the processor being further arranged to receive a series of said input signals related respectively to a series of said predetermined time periods, to arrange for said phase value to select the phases to be activated in each time period, to record any error between the desired power supply voltage and an actual power supply voltage produced by the switched-mode power supply and to feed an error signal forward into the next time period to adjust the next phase value to take account of the recorded error.

13. An amplifier according to claim 12, wherein the input signal is representative of the envelope of a RF signal to be amplified by the amplifier.

14. A cellular base station including a RF amplifier unit having an amplifier and a switched mode, multiphase power supply, the power supply comprising a signal input arranged to receive an input signal representative of a desired power supply voltage over a predetermined time period, a processor arranged to process the input signal to derive a phase value indicative of the number of power supply phases which should be enabled to achieve the desired power supply voltage, and a phase activator arranged to activate only the number of phases indicated by the phase value, for substantially the predetermined time, the processor being further arranged to receive a series of said input signals related respectively to a series of said predetermined time periods, to arrange for said phase value to select the phases to be activated in each time period, to record any error between the desired power supply voltage and an actual power supply voltage produced by the switched-mode power supply and to feed an error signal forward into the next time period to adjust the next phase value to take account of the recorded error.

* * * * *